PHOTOPOLYMERIZABLE ELEMENTS AND PROCESSES

Filed Feb. 18, 1957

INVENTOR
LOUIS PLAMBECK, JR.

BY Lynn Barratt Morris
ATTORNEY

United States Patent Office 2,964,401
Patented Dec. 13, 1960

2,964,401

PHOTOPOLYMERIZABLE ELEMENTS AND PROCESSES

Louis Plambeck, Jr., Wilmington, Del., assignor to E. I. du Pont de Nemours and Company, Wilmington, Del., a corporation of Delaware Filed Feb. 18, 1957, Ser. No. 640,743
10 Claims. (Cl. 96—35)

Figures 1, 2, 3, 4, 5, 6:
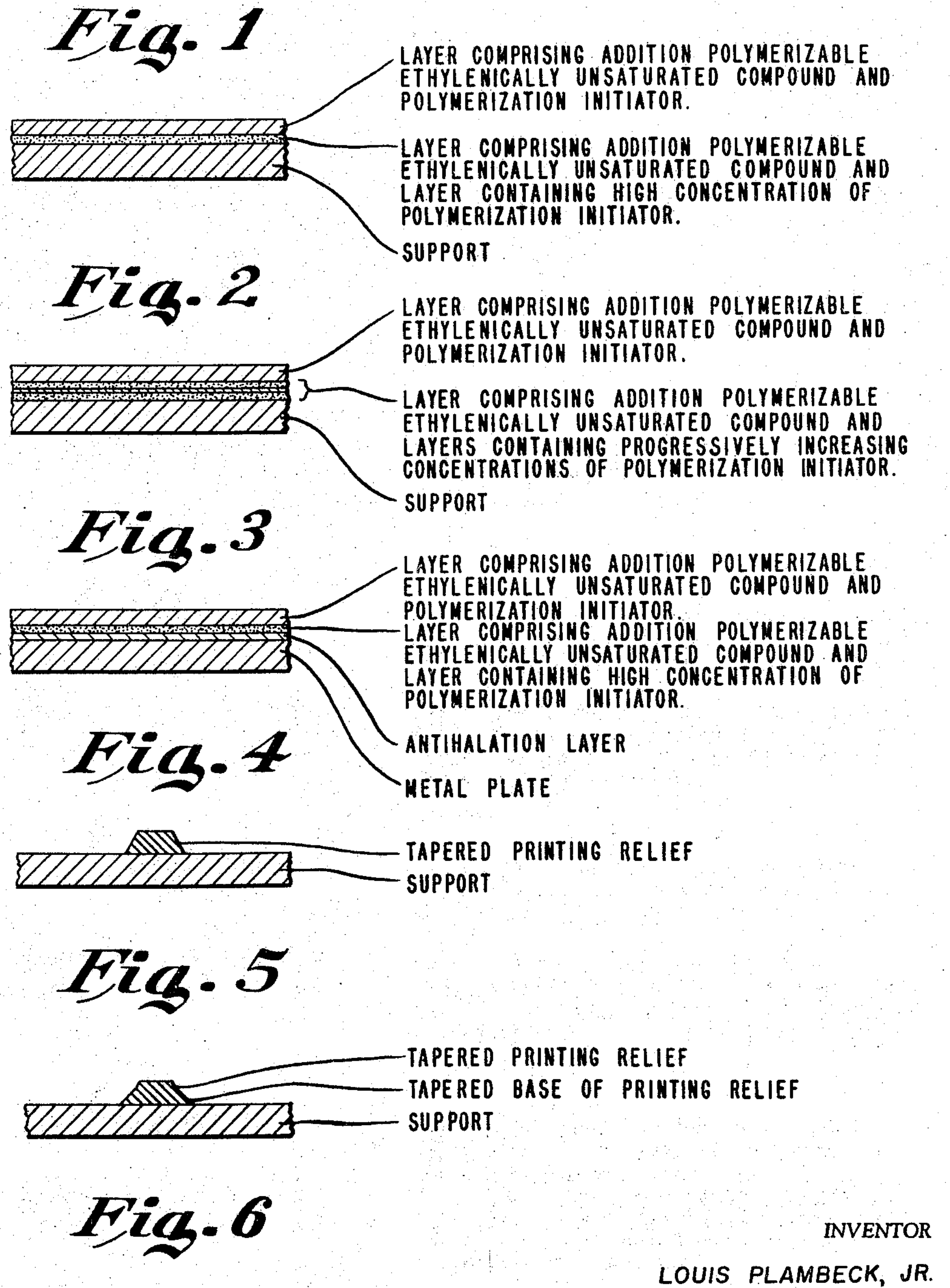

This invention relates to photopolymerizable elements and more particularly to such elements which are suitable for the preparation of letterpress printing reliefs. Still more particularly it relates to photopolymerizable elements which are useful for the preparation of line and halftone printing reliefs simultaneously by a photopolymerization process. The invention also relates to a photopolymerization process and to printing reliefs.

Photopolymerizable elements useful for the preparation of printing reliefs are disclosed in Plambeck U.S. Patent No. 2,760,863, granted August 28, 1956, and certain of these elements are claimed in divisional application Ser. No. 541,723, filed October 20, 1955 (U.S. Patent 2,791,504, May 7, 1957). In these elements the addition polymerization initiator is uniformly dispersed throughout the entire thickness of the photopolymerizable layer. These elements are useful for making line and halftone printing reliefs, or both simultaneously in the same photopolymerizable layer. In the case of layers more than 30 mils in thickness, there is a tendency for highlight halftone dots to be incompletely converted to the insoluble state at their base at exposure levels correct for the shadow areas. If the exposure is continued until the highlight dots are insolubilized at the lower surface of the layer, the shadow areas become plugged and the recesses in characters, for example the center of an "o" or an "e", may be filled, with the result that the relief has insufficient depth for a clear sharp print.

An object of this invention is to provide improved photopolymerizable elements. A further object is to provide such elements having a photopolymerizable layer which gives sharp clean reliefs in finely detailed areas, halftones and fine rulings, etc. Another object is to provide such elements which are useful in making line and halftone reliefs simultaneously from a process negative containing line and halftone images, especially in relief heights greater than 30 mils. Yet another object is to provide a photopolymerizable element whereby the shape of the base of the relief can be controlled automatically. A further object is to provide such elements which can be readily processed by the ordinary technician. A still further object is to provide such elements which can be given a normal exposure in the halftone areas without overexposing larger characters etc., in other areas of a process transparency or stencil. A still further object is to provide a process for making printing reliefs using a photopolymerizable layer more than 30 mils thick which gives halftone reliefs in combination with comparatively large line reliefs both of which are clear and sharp. Still other objects will be apparent from the following description of the invention.

The photopolymerizable elements of this invention comprise a sheet support and a photosensitive layer from 8 to 250 mils or more in thickness, the upper stratum of said layer constituting at least 3 mils but not more than half of said thickness and comprising at least one addition polymerizable ethylenically unsaturated compound and an addition polymerization initiator activatable by actinic light and at least one lower stratum having a concentration of initiator greater than enough to effect uniform polymerization, and normally at least 1.5 times that in the upper straum. The lower portion of the layer may have a plurality of strata wherein the concentration of initiator increases in accordance with increases in the depth of the layer. The relief height-forming stratum of the photopolymerizable layer should exhibit an optical density to actinic light less than 5.0.

In the attached drawing, which constitutes a part of this application,

Fig. 1 is a cross-sectional view of a photopolymerizable element of this invention having a single layer of increased concentration of initiator, Fig. 2 is a cross-sectional view of an alternative photopolymerizable element having a plurality of lower layers of increased concentration, Fig. 3 is a cross-sectional view of a photopolymerizable element having a layer of increased concentration of initator, an antihalation layer and a metal plate as the base support, Fig. 4 is a cross-sectional view of a printing relief made from a photopolymerizable element with no initiator differential in the photosensitive layer, Fig. 5 is a cross-sectional view of a printing relief made from a photopolymerizable element with an initiator differential in the photosensitive layer.

The novel photopolymerizable elements can be made in various manners. For example, the supporting surface, which can be the actual support or an anchor layer or antihalation layer on the support, is provided with a thin layer composed of an addition polymerization initiator activatable by actinic light to form a relatively high concentration of the initiator in the lower layer and an outer layer of addition-polymerizable material containing a lower concentration of said initiator.

The initiator can be coated from an aqueous or organic solvent solution which can contain an addition polymerizable ethylenically unsaturated monomer or polymer or a mixture of monomers and/or polymers, a compatible filler and/or a plasticizer, or the initiator can be melt-cast onto the surface of the support or a layer carried by the support.

Alternatively, a suitable film from the above-mentioned solutions or a liquefied composition may be cast onto a smooth casting surface, e.g., a glass plate, a polished metal plate, a polished metal drum or belt, the photopolymerizable film stripped from the smooth casting surface and placed or pressed into surface contact with a similar film made from a similar solution but containing a lesser amount of initiator. If the films are still wet or still have a tacky adhesive surface, the adherence or bonding between the surfaces is generally sufficient. By heating and pressing the two films, a firm bond can be had. The resulting laminate or composite film is then pressed into contact with a suitable adhesive layer (which may contain an antihalation material) on a permanent support. By means of heat and pressure there will result a firm bond between the photopolymerizable layer, adhesive layer and support.

If a plurality of photopolymerizable layers of progressively increasing concentration of initiator is desired, the above coating and procedures will be repeated.

The differential between the amount of initiator in the lower and upper portions of the photosensitive layer will vary with the thickness, but in general the upper stratum containing the least amount of initiator is approximately ¼ to ½ of the total depth of the photopolymerizable composition. Some upward migration of initiator takes place during the manufacture of the elements.

The initiator concentration in the photopolymerizable elements may vary from 0.01% at the printing surface to the solubility limit of the particular initiator at the support addition-polymerizable layer interface; however the maximum concentration of initiator should not exceed 35% by weight of the addition-polymerizable ethylenically unsaturated component in the elements. The optimum amount of initiator to be used will, of course, vary with the particular initiator and photopolymerizable layer. In general, the photosensitive layers, i.e., the photopolymerizable layer and the initiator layer of increased concentration together, should have an optical density to actinic light less than 5 and preferably also less than 0.5 per mil of total photosensitive layers.

By having an increased amount of initiator in the lower stratum, the base of the relief is broadened, which strengthens the relief. In addition, a stronger bond is obtained between the polymer images formed and the surface of the support. If the upper strata, on the other hand, contain an increased amount of initiator, polymerization is promoted near the printing surface, thereby reducing image fidelity and faithfulness of reproduction when exposure is sufficient to insolubilize the lower strata. The improved results cannot be attained by the use of large amounts of initiator homogeneously dispersed throughout the entire photopolymerizable layer because the exposure time necessary for adequate attachment of the character of the relief image to the base is too long to permit good character structure at the top.

The photopolymerizable layer can be composed of any addition-polymerizable compound (e.g., ethylenically unsaturated monomer) and any addition polymerization initiator activatable by actinic light, both either singly or in admixture with one or more other similar monomers and initiators. The photopolymerizable layer can also contain added preformed compatible condensation of addition polymers, generally the latter, and conveniently of the same general type as the polymerizable monomer or monomers being used, as well as immiscible polymeric or nonpolymeric organic or inorganic filler materials that are essentially transparent in the layer, e.g., the organophilic silicas, bentonites, silica, powdered glass, etc., having a particle size less than 0.4 in amounts varying with the desired properties of the photopolymerizable layer, which can be liquid or solid, including gel, in nature. The preferred monomers are the ethylenically-unsaturated, addition polymerizable monomers, particularly those wherein the said ethylenic linkages are terminal, i.e., those monomers having the characteristic $CH_2{=}C<$ group, i.e., the vinylidene monomers. Because of the greater speed with which such compositions polymerize to rigid materials, it is preferred that the photopolymerizable layer contain appreciable proportions of ethylenically unsaturated polymerizable materials containing a plurality of said polymerizable linkages per molecule. These types of monomers are conventionally referred to as cross-linking agents. This cross-linking facility can be incorporated in the photopolymerizable layer through the use of polymers containing the indicated plurality of polymerizable unsaturated linkages in which instance such materials serve a dual function of both increasing the viscosity of the photopolymerizable layer to the desired level and making available the desired cross-linking facility for the photopolymerization.

Suitable base or support materials include metals, e.g., steel and aluminum plates, sheets and foils, and films or plates composed of various film-forming synthetic resins or high polymers, such as the addition polymers, including those mentioned later, in both monomeric and polymeric form for use in the photopolymerizable layer and in particular the vinylidene polymers, e.g., the vinyl chloride polymers, vinylidene chloride copolymers with vinyl chloride, vinyl acetate, styrene, isobutylene and acrylonitrile; and vinylchloride copolymers with the latter four monomers; the linear condensation polymers such as the polyesters, e.g., polyethylene terephthalate; the polyamides, e.g., polyhexamethylenesebacamide; polyester amides, e.g., polyhexamethyleneadipamide/adipate; etc. Fillers or reinforcing agents can be present in the synthetic resin or polymer bases such as the various fibers (synthetic, modified or natural), e.g., cellulosic fibers, for instance, cotton, cellulose acetate, viscose rayon, paper; glass wool; nylon, and the like. These reinforced bases may be used in laminated form.

When highly reflective bases and particularly metal base plates are used, any oblique rays passing through clear areas in the image-bearing transparency will strike the surface of the base at an angle other than 90° and after resultant reflection will cause polymerization in non-image areas. The degree of unsharpness in the relief progressively increases as the thickness of the desired relief and the duration of the exposure increases. It has been found that this disadvantage can be overcome in carrying out the invention when the photopolymerizable composition is deposited on a light reflective base by having an intervening stratum sufficiently absorptive of actinic light so that less than 35% of the incident actinic light is reflected. This light-absorptive stratum must be adherent to both the photopolymerized image and the base material. The light-absorptive layer can be formed directly on the surface of the light reflective base, for instance, by dyeing in the case of anodized aluminum plates, by "blueing" or chemical blackening such as is obtained with molten dichromate baths in the case of iron or steel plates. In these instances a separate resin anchor layer adherent to the colored base and the photopolymerizable layer is applied. A practical method of supplying the layer absorptive of reflected light, or non-halation layer, is to disperse a finely divided dye or pigment which substantially absorbs actinic light in a solution or aqueous dispersion of a resin or polymer which is adherent to both the support and the photopolymerized image and coating it on the support to form an anchor layer which is dried.

The invention will be further illustrated but is not intended to be limited by the following examples, wherein the parts and percentages stated are parts by weight, unless otherwise indicated.

EXAMPLE I

A coating composition was prepared by admixing four parts by volume of the following milled composition:

| | Parts |
|---|---|
| Polyvinyl n-butyral | 8.9 |
| Zinc tetroxychromate | 8.5 |
| Lampblack | 0.1 |
| Fibrous magnesium silicate | 1.3 |
| Methyl isobutyl ketone | 17.8 |
| Isopropyl alcohol | 63.4 |

with one part by volume of the following composition:

| | Parts |
|---|---|
| Water | 16.4 |
| Isopropyl alcohol | 65.1 |
| Phosphoric acid | 18.5 |

and the mixture was painted onto the surface of several 4 by 5 inch aluminum plates and the coatings were allowed to dry. The phosphoric acid caused the butyral to cross-link thereby forming an insoluble coating. An anchor layer was painted onto each such coating from a solution of the following composition:

| | Parts |
|---|---|
| Methyl methacrylate monomer | 230 |
| Poly(methyl methacrylate) | 120 |
| n-Butyl methacrylate | 125 |
| Polyethylene glycol (average mol. wt. 200) dimethacrylate | 25 |
| Benzoin methyl ether | 5 |

The layer was polymerized to a hard resin by means of ultraviolet light. A saturated solution of benzoin methyl ether in acetone was painted onto the surface of the dry anchor layer of three of the coated aluminum plates. A fourth coated plate with no layer of benzoin methyl ether and the three plates having a layer of such ether had their coated surfaces provided with a 30-mil layer of a viscous photopolymerizable liquid comprising 70% by weight of 3/1-polypropylene glycol phthalate/maleate dissolved in 30% by weight of styrene. A process negative containing an array of geometric characters varying in size from a 3-mil dot to a reverse area (a large solid area) and including lines of varying widths was placed emulsion side down into contact with the photopolymerizable layer on each of the four plates and the layer was exposed through said negative to ultra violet radiation from a bank of twenty 30-watt fluorescent tubes having peak emission at 3650 A. for the periods and with the following results:

| Plate | Initiator in sublayer | Exposure (Minutes) | Quality of Printing Characters Formed |
|---|---|---|---|
| 1 | Present | 12 | Bases of characters were broad and firmly attached throughout. |
| 2 | do | 10 | Like plate 1. |
| 3 | do | 8 | Generally good, but attachment of some characters to the base was inadequate. |
| 4 | Absent | 12 | Like plate 3. |

Thus it may be seen that improvement in quality as well as reduction in exposure time was obtained by having a relatively high concentration of initiator in the sublayer at the interface with the anchor layer.

EXAMPLE II

One gram of benzoin methyl ether was melted onto the surface of each of three 4" x 5" aluminum plates bearing primer and anchor layers like those described in Example I. A 60-mil layer of the polymerizable liquid of Example I, containing 1% by weight benzoin methyl ether, was coated onto the initiator layer of each plate, and an image was formed by exposure to ultraviolet radiation through a process negative having a section containing a letter text and a section containing a halftone image made with a halftone screen. Exposure times were 12, 15 and 18 minutes. The 12-minute exposure produced a slightly underexposed plate but the 15- and 18-minute exposures resulted in plates of equal or better quality than a similar plate having no benzoin methyl ether sublayer and a 30-mil photopolymerizable layer as in this example. These plates require no routing for satisfactory prints.

EXAMPLE III

Three 120-line halftone printing plates with an image in a layer polymerized to a depth of 40 mils were prepared from the polymerizable liquid of Example I, containing 1% by weight benzoin methyl ether. Aluminum plates coated with the primer and anchor layers of Example I were employed as the supports. As shown in the following table, plate 1, used as a control, was not provided with a benzoin methyl ether substratum, plate 2 was provided with a substratum containing 0.5 g. benzoin methyl ether/25 sq. in., and plate 3 with a substratum containing 1.25 g. benzoin methyl ether/25 sq. in. The finished plates were tested for printing quality on a flat-bed press with the following results:

| Plate | Amount of Benzoin Methyl Ether at Support-Polymerizable Layer Interface | Plate Quality |
|---|---|---|
| 1 | None | Highlight dots lost. |
| 2 | 0.5 per 25 sq. in. | Highlight dots held. |
| 3 | 1.25 per 25 sq. in. | Do. |

Both the plate and print were of superior quality where the anchor layer on the support had been treated with the initiator prior to application of the photopolymerizable liquid.

EXAMPLE IV

Two printing plates were made from a 133-line gray-scale process contact negative (a step wedge of 10 steps, the densest, i.e., the one containing the smallest dots, consisting of 90% black area and the least dense of 10% black area) having the photopolymerizable liquid of Example I on the initiator layers of aluminum plates as described in Example I. Plate A was made in the usual way, whereas Plate B was first coated with 0.05 g. benzoin methyl ether/sq. in. Upon development, the dot structure of the last highlight step of the gray scale (the step in which the dots were smallest) was washed away from Plate A, but the dot structure was retained on Plate B.

EXAMPLE V

The following solutions were prepared:

*No. 1 solution*

| | Grams |
|---|---|
| Acetone | 300 |
| Cellulose acetate | 50 |
| Triethylene glycol diacrylate | 33 |
| Benzoin | 3.3 |

*No. 2 solution*

| | |
|---|---|
| Acetone | 300 |
| Cellulose acetate | 50 |
| Triethylene glycol diacrylate | 33 |
| Benzoin | 0.33 |

A ⅛-inch layer of solution No. 1, containing ten times as much benzoin as the second solution, was cast on glass and the sheet of polymerizable material allowed to become almost dry. On top of this sheet there was cast a ⅛-inch layer of solution No. 2, and when dry, the composite sheet was stripped from the glass surface. A ¼-inch layer of solution No. 2 was cast in like manner, allowed to dry and was stripped. A sample from each of these sheets of photopolymerizable material was bonded by light pressure at 110° C. to a rigid support by means of the "Scotch-Weld" adhesive made by the Minnesota Mining and Manufacturing Co. (a butadiene/acrylonitrile copolymer combined with a phenol/formaldehyde resin; this combination is an adhesive that is largely thermoplastic but has a small amount of thermosetting effect also). The adhesive also served as an anti-halation layer. The samples were exposed under a negative having a transparent dot the size of a standard typewriter period as the image in an opaque background for 5 minutes to actinic radiation from a 2000-watt high-pressure mercury-arc lamp at a distance of 8 inches and washed in acetone for 3 minutes. The structure of the two sheets differed. The first contained an initiator differential, i.e., 1% of initiator by weight based on the monomer content in the top layer and 10% in the lower layer. The second sheet contained initiator at the 1% level throughout. A cross-section of the character formed with no initiator differential is shown in Fig. 4 of the drawing, whereas a cross-section like that of Fig. 5 is obtained when an initiator differential is used. It is clearly seen that there is increased polymerization and hardening at the polymer-support interface of the sample with the initiator differential and therefore improved attachment of small characters.

EXAMPLE VI

The following solutions A and B were prepared and cast on glass plates to dry:

| | A | B |
|---|---|---|
| 1. Cellulose acetate ---- g | 40 | 40 |
| Acetone ---- ml | 125 | 125 |
| Triethylene glycol diacrylate ---- g | 26 | 26 |
| Benzoin ---- g | 1.3 (5%) | 0.26 (1%) |
| Di-tert-butyl p-cresol ---- g | 0.026 | 0.026 |
| 2. Cellulose acetate ---- g | 40 | 40 |
| Acetone ---- ml | 125 | 125 |
| Triethylene glycol dimethacrylate ---- g | 26 | 26 |
| Benzoin methyl ether ---- g | 1.3 (5%) | 0.26 ((1%) |
| Di-tert-butyl p-cresol ---- g | 0.026 | 0.026 |
| 3. Cellulose acetate hydrogen succinate ---- g | 40 | 40 |
| Acetone ---- ml | 125 | 125 |
| Triethylene glycol diacrylate ---- g | 20 | 20 |
| Phenacyl chloride ---- g | 1.0 (5%) | 0.20 (1%) |
| Di-tert-butyl p-cresol ---- g | 0.020 | 0.020 |
| 4. Cellulose acetate hydrogen succinate ---- g | 40 | 40 |
| Acetone ---- ml | 125 | 125 |
| Triethylene glycol diacrylate ---- g | 26 | 26 |
| Benzoin ---- g | 1.3 (5%) | 0.26 (1%) |
| Hydroquinone ---- g | 0.013 | 0.013 |

After the photopolymerizable layers were dry they were removed from the glass plates, and 2-inch squares were cut from each. The squares of each pair were laminated together by placing the B squares above the A squares and subjecting them to a pressure of about 500 lb. per sq. in. in a hydraulic press heated to 110° C. Each laminated sample was then bonded by light pressure at the same temperature to an aluminum support by means of the "Scotch-Weld" adhesive described in Example V in such a way that the surface of the A composition was in contact with the adhesive. Each sample was given a 5-minute exposure to the radiation of a 2000-watt high-pressure mercury-arc lamp through a lithographic negative containing a small dot as the transparent image. After exposure, each photopolymerizable layer was washed out with the appropriate solvent, namely, acetone for cellulose acetate and dilute aqueous ammonia for cellulose acetate hydrogen succinate. It was observed in each case that the image had the cross-sectional shape shown in Figure 5.

A piece of photopolymerizable sheet 3B was laminated to a piece of photopolymerizable sheet 3A, and the laminate was bonded to an aluminum support with "Scotch-Weld" adhesive so that the surface of 3A was next to the support. The plate was given a 6-minute exposure through a process negative containing lettertext characters. After washout in aqueous ammonia solution, it was found that approximately the top quarter of each character had nearly parallel sides, whereas in cross-section the lower portion formed a much more acute angle with the base, this shape affording good anchorage of the character to the support by a broad base. The total image was 57 mils in depth.

A sample of photopolymerizable sheet 3B was laminated to photopolymerizable sheet 3A and bonded to aluminum as described above. The total thickness of the photopolymerizable composition was 57 mils. After exposure through a halftone gray scale and washout with aqueous ammonia solution, it was found that no highlight dots were missing and no shadows were plugged.

EXAMPLE VII

The following compositions:

| Composition | I | II |
|---|---|---|
| Cellulose acetate hydrogen succinate ---- g | 103 | 103 |
| Triethylene glycol diacrylate ---- g | 50 | 50 |
| Hydroquinone monomethyl ether ---- g | 0.050 | 0.050 |
| Benzoin methyl ether ---- g | 5.0 | 0.5 |
| Distilled water ---- g | 97 | 97 |
| Ethyl alcohol ---- ml | 25 | 25 |

were separately prepared by thoroughly mixing the components for 5 minutes. The admixture was allowed to age for about 20 hours and was then milled at 105° C. for 10 minutes. A part of each composition was pressed at 150° C. to a thickness of 90 mils. A pressed sheet of composition II, thus prepared, was placed on a similarly pressed sheet of composition I. The resultant laminate was bonded to an aluminum plate 17 mils thick provided with an amorphous coating 0.005 to 0.001 mil thick of a mixed metallic oxide-chromate (Alodized aluminum produced by the American Chemical Paint Co., Ambler, Pa.) which was dyed with a mixture of 87% Tartrazine (C.I. 640) and 13% Azorubin (C.I. 179) to form a yellow antihalation coating having a reflection density determined in the Cary spectrophotometer of 0.97 at 3000 A. and 0.90 at 4000 A. The bonding was accomplished by the use of a copolyester adhesive such as is disclosed in Williams U.S. Patent 2,765,251. The resultant photopolymerizable plate was exposed for 6 minutes at 60° C. in a vacuum frame under a process negative containing a large letter P (¾ in. in height) to a 2000-watt high-pressure mercury-arc lamp mounted in a parabolic reflector, said lamp being at a distance of 6 inches from said plate. The exposed plate was developed by spraying with 0.025 M NaOH at 75° F. for 23 minutes. The resultant image was 166 mils in depth, the lower half of the image forming in profile an internal angle with the base of about 40° and the upper half an internal angle of about 70°. The character formation was perfect throughout with no evidence of undercutting at the base. Another portion of the photopolymerizable plate was exposed similarly under a process negative containing both lettertext and a 65-line halftone. After the spray development, the relief was 166 mils high, and character formation was perfect throughout.

The light-polymerization need not extend through the entire photopolymerisable layer, particularly where the layer has good mechanical strength before exposure. If desired, after development of the relief, the plate can be heated or exposed to polymerize the lower portion. Moreover, the lower stratum of the photopolymerizable layer can serve as part of the support or as a support for the photopolymerizable stratum and, when it contains a light-absorbing dye or pigment, can function to prevent light from being reflected into the upper photopolymerizable relief-forming stratum.

As is apparent from the above, letterpress printing plates can be made after the manner disclosed in Plambeck U.S. Patent 2,760,863, granted Aug. 28, 1956, by exposing to actinic light through a process transparency, e.g., a process negative or positive (an image-bearing transparency consisting solely of substantially opaque and substantially transparent areas where the opaque areas are substantially of the same optical density, the so-called line or half-tone negative or positive), a photopolymerizable layer or stratum comprising a polymerizable ethylenically unsaturated component (e.g., a compound or mixture of compounds) capable of forming a high polymer by photo-initiated polymerization in the presence of an addition polymerization initiator therefor activatable by actinic light, said layer having intimately dispersed therethrough an addition polymerization initiator activatable by actinic light, said layer or stratum being superposed on a suitable adherent support, i.e., adherent to the photopolymerized composition, until addition polymerization is essentially complete, i.e., to the insoluble state, in the exposed areas with no significant polymerization taking place in the non-exposed areas, and essentially completely removing from the original the unexposed portions of the layer, e.g., the unpolymerized composition together with any admixed material in said non-exposed areas. The photopolymerizable layer need not be composed of monomers only but can also contain some polymer, including incompletely polymerized compounds, but substantially no further polymer forms in the unexposed areas during exposure.

Practically any initiator of addition polymerization which is capable of initiating polymerization under the influence of actinic light can be used in the photopolymerizable compositions of this invention. Since process transparencies or stencils transmit both heat and light and the conventional light sources give off heat and light, the preferred initiators are thermally inactive at temperatures below 85° C. Suitable photopolymerization initiators include vicinal ketaldonyl compounds, e.g., diacetyl, benzil, etc., α-ketaldonyl alcohols, e.g., benzoin, pivaloin, etc.; acyloin ethers, e.g., benzoin methyl or ethyl ethers; azonitriles, e.g., 1,1'-azadicyclohexane carbonitrile; α-hydrocarbon-substituted aromatic acyloins including α-methylbenzoin, α-allylbenzoin, etc. (U.S. Patent 2,722,512); O-alkyl xanthate esters of the type described in U.S. Patent 2,716,633.

A wide variety of monomers and compatible polymers may be compounded to form suitable photopolymerizable mixtures for making relief-image printing plates. Preferred compositions, however, are prepared by combining such polymers as vinyl chloride copolymers, cellulose esters, e.g., cellulose acetate, cellulose acetate hydrogen succinate, cellulose nitrate, polyvinyl alcohol derivatives, e.g., polyvinyl butyral, soluble polyamides, e.g., N-methoxymethyl polyamide, and vinylidene copolymers, e.g., vinylidene chloride/acrylonitrile copolymers, with monomers, e.g., mono-, di-, and triethylene glycol diacrylate, mono-, di-, and triethylene glycol dimethacrylate, pentaerythritol acrylates and methacrylates, and various polymethacrylamides.

Actinic light from any source and of any type can be used in these photopolymerization processes. The light may emanate from point sources or be in the form of parallel rays or divergent beams. It is preferred to use a broad light source close to the image-bearing transparency from which the relief is to be made. By using a broad light source, relatively close to the image-bearing transparency, the light rays passing through the clear areas of the transparency enter as divergent beams and thus irradiate a continually diverging area in the photopolymerizable layer underneath the clear portions of the transparency, resulting, in the thinner layers and with the larger characters, in a polymeric relief having its greatest width at the bottom of the photopolymerized layer, i.e., a frustum, the top surface of the relief being the dimensions of the clear area.

As has been stated above, however, with thicker layers of photopolymerizable material and smaller characters, even with a broad light source, the greater width at the bottom of the character has occasionally not been produced because of incomplete polymerization at the base. With the initiator differential of the present invention, however, and especially with a broad light source, reliefs are obtained which in three dimensions comprise two frustums, one on top of the other, with the base angles of the uppermost being much greater than the base angles of the lower frustum and with the major base of the lower frustum being much greater than that of the upper one. Similarly, the cross-section of the reliefs thus involve two trapezoids, one superposed on the other, with the same relationship between the base angles and the bases thereof. The preferred thickness of the photosensitive layer including the stratum of increased amount of initiator is 10 to 60 mils.

Inasmuch as the free-radical-generating addition-polymerization initiators activatable by actinic light generally exhibit their maximum sensitivity in the ultraviolet range, the light source should furnish an effective amount of this radiation. Such sources include carbon arcs, mercury-vapor arcs, fluorescent lamps with special ultraviolet-light-emitting phosphors, argon glow lamps, and photographic flood lamps. Of these, the mercury-vapor arcs, particularly the sun-lamp type, and the fluorescent sun-lamps, are most suitable. The sun-lamp mercury-vapor arcs are customarily used at a distance of one and one-half to ten inches from the photopolymerizable layer.

The printing reliefs made in accordance with this invention can be used in all classes of printing but are most applicable to those classes of printing wherein a distinct difference of height between printing and nonprinting areas is required. These classes include those wherein the ink is carried by the raised portion of the relief such as in dry-offset printing, ordinary letterpress printing, the latter requiring greater height differences between printing and nonprinting areas, and those wherein the ink is carried by the recessed portions of the relief such as in intaglio printing, e.g., line and inverted halftone. The plates are obviously useful for multicolor printing.

An advantage of this invention is that it provides photopolymerizable elements which can be readily photopolymerized to form high quality images of sufficient thickness to eliminate routing when the process negative contains very small and very large clear areas. It provides photopolymerizable elements which are useful for forming a single printing plate having line and very fine halftone images from a single exposure through a negative containing such images.

An important advantage of the invention is that it provides simple and dependable means (i.e., photopolymerizable elements) for controlling the shape of the base of a photopolymerized relief. The broadening of the base to form two or more superposed frustums takes place automatically and, therefore, eliminates tedious control of exposure by the technician.

Another advantage is that it provides printing reliefs which have good strength at the base due to the multiple frustum shape. This broadening of the base is a surprising and wholly unexpected result.

An important commercial advantage is that much less exposure time is required for making printing reliefs by photopolymerization of layers 30 to 250 or more mils in thickness than that required by the prior art elements. Another advantage is that halftone screens having at least 150 lines per inch can be used and text images and halftone images from such screens may be used. A further advantage is that small characters having better adhesion to the base are obtained and they are less likely to break off or bend over during printing. Still other advantages of the invention will be apparent from the above.

I claim:

1. A photopolymerizable element comprising a support and a solid photosensitive layer from 8 to 250 mils in thickness comprising (1) a normally non-gaseous addition-polymerizable ethylenically unsaturated compound capable of forming a high polymer by photoinitiated polymerization in the presence of an addition polymerization initiator therefor activatable by actinic light, (2) polymerization-effective amounts of such an initiator being present throughout said layer, and (3) a preformed compatible organic polymer, the upper stratum of said layer being at least 3 mils thick and constituting not more than one-half of said thickness, and a lower stratum of said layer having a concentration of initiator greater than enough to effect uniform polymerization therein and at least 1.5 times that in the upper stratum, the concentration of initiator in the element being not more than 35% by weigh of said compound.

2. An element as set forth in claim 1 wherein said initiator is thermally inactive below 85° C.

3. An element as set forth in claim 1 wherein said upper stratum is not more than ¼ the total thickness of the photosensitive layer.

4. An element as set forth in claim 1 wherein said support is metal and a stratum containing an antihalation material is disposed below the bottom surface of said layer.

5. An element as set forth in claim 1 wherein at least one addition-polymerizable compound in the layer contans at least one terminal $CH_2{=}C<$ group.

6. An element as set forth in claim 1 wherein said layer contains a substantial amount of a cross-linking ethylenically unsaturated addition polymerizable material containing a plurality of ethylenic groups.

7. An element as set forth in claim 1 wherein said initiator is a free-radical-generating addition-polymerization initiator therefor activatable by actinic light and essentially inactive thermally below 85° C.

8. An element as set forth in claim 1 wherein the lower major thickness of the layer has a plurality of strata containing the initiator in progressively increasing concentration.

9. The process of making a printing relief which comprises exposing to actinic light, through a transparency having light-opaque areas of the same optical density and transparent areas of the same optical density a photopolymerizable element comprising an adherent support and a solid photosensitive layer from 8 to 250 mils in thickness comprising (1) a normally non-gaseous addition-polymerizable ethylenically unsaturated compound capable of forming a high polymer by photoinitiated polymerization in the presence of an addition-polymerization initiator activatable by actinic light, (2) from 0.01% to about 35% by weight, based on said unsaturated compound, of such an initiatior and (3) a preformed compatible organic polymer, the upper stratum of said layer being at least 3 mils thick, and a lower stratum of said layer having a concentration of initiator greater than enough to effect uniform polymerization therein and at least 1.5 times that in the upper stratum capable of forming a multiple frustum in the layer, the concentration of initiator in the element being not more than 35% by weight of said unsaturated compound, until substantial photopolymerization of the layer to the insoluble state occurs in the exposed areas of the addition-polymerizable stratum with substantially no polymerization in the nonexposed areas, and removing unexposed and unpolymerized portions of said layer.

10. A process as set forth in claim 9 wherein the incident light passes through the layer at an angle so as to produce a tapered relief.

References Cited in the file of this patent

UNITED STATES PATENTS

| | | |
|---|---|---|
| 2,760,863 | Plambeck | Aug. 28, 1956 |

FOREIGN PATENTS

| | | |
|---|---|---|
| 541,512 | Great Britain | Nov. 28, 1941 |
| 541,513 | Great Britain | Nov. 28, 1941 |
| 541,515 | Great Britain | Nov. 28, 1941 |
| 6,368 | Great Britain | of 1885 |